(12) United States Patent
Beeteson et al.

(10) Patent No.: US 6,236,164 B1
(45) Date of Patent: *May 22, 2001

(54) CURRENT SENSING IN VACUUM ELECTRON DEVICES

(75) Inventors: John Beeteson, Ayrshire; Andrew Ramsay Knox, Kilbirnie, both of (GB)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/799,520

(22) Filed: Feb. 12, 1997

(30) Foreign Application Priority Data

Jun. 1, 1996 (GB) .................................. 9611469

(51) Int. Cl.⁷ ..................................... H01J 31/00
(52) U.S. Cl. ..................... 315/167; 315/168; 250/208.2
(58) Field of Search .................... 315/160, 167, 315/168; 250/208.2

(56) References Cited

U.S. PATENT DOCUMENTS

| | | | |
|---|---|---|---|
| 3,805,058 | * 4/1974 | Glaenzer | 250/208.2 |
| 4,467,205 | 8/1984 | Beisswenger et al. | 250/397 |
| 4,525,653 | 6/1985 | Smith | 315/366 |
| 4,672,272 | 6/1987 | Littwin | 315/169.1 |
| 4,745,344 | 5/1988 | Tomii et al. | 315/366 |
| 4,834,438 | 5/1989 | Haidet | 294/31.2 |

FOREIGN PATENT DOCUMENTS

| | | |
|---|---|---|
| 0 213 839 | 3/1987 | (EP) . |
| 0 404 022 | 12/1990 | (EP) . |
| 1 171 608 | 11/1966 | (GB) . |
| 1 380 126 | 1/1975 | (GB) . |
| 1 390 425 | 4/1975 | (GB) . |
| 3-81937 | 4/1991 | (JP) . |

* cited by examiner

Primary Examiner—David Vu
(74) Attorney, Agent, or Firm—Scully, Scott, Murphy & Presser; Marian Underweiser, Esq.

(57) ABSTRACT

A vacuum electron device comprises an evacuated envelope containing a cathode for supplying electrons to form an electron beam, an anode spaced from the cathode for receiving the electron beam, and a sensor electrode located between the cathode and the anode.

10 Claims, 5 Drawing Sheets

CURRENT SENSING IN VACUUM ELECTRON DEVICES

BACKGROUND OF THE INVENTION

1. Field of the Invention

The present invention generally relates to vacuum electron devices and particularly relates to electron current sensing in vacuum electron devices.

2. Background Description

A conventional vacuum electron device comprises an cathode and anode contained in an evacuated envelope. In operation, the cathode is held at a negative potential relative to the anode. Electrons are emitted from the cathode. The potential difference between the cathode and the anode accelerates the emitted electrons from the cathode towards the anode in a beam. A beam current thus flows between the anode and the cathode. In some conventional vacuum electron devices, such as cathode ray display tubes (CRTs), one or more grid electrodes are disposed between the cathode and the anode. In operation, a control voltage is applied to each of the one or more grid electrode(s). The control voltage imposes an electrostatic force on the electron beam. The electron beam current can be adjusted by adjusting the control voltage. The control voltage is typically generated by a control sub-system of the circuit containing the vacuum electron device. In a CRT display, this control sub-system controls the brightness of the picture produced on the screen. In general, such control systems are open loop systems. In such a system, there is no feedback provided between the beam current flowing and the control voltage applied to the grid electrode. In conventional CRT displays, indirect feedback of the beam current is provided by measuring by sensing the current flowing in the anode voltage generator. This technique provides useful control information for controlling a vacuum electron device in which there is only a single electron beam, such as monochrome CRTS. This technique is also suitable for controlling total beam current in a multiple beam vacuum electron device such as a colour cathode ray tube. However, this technique is not suitable for controlling individual beam current in such a device because the individual beam currents are effectively summed at the anode.

SUMMARY OF THE INVENTION

In accordance with the present invention, there is now provided a vacuum electron device comprising an evacuated envelope containing a cathode for supplying electrons to form an electron beam, an anode spaced from the cathode for receiving the electron beam, and a sensor electrode located between the cathode and the anode.

Preferably, the sensor electrode extends into the path of the electron beam from the cathode to the anode.

The sensor electrode may comprise a triangular portion having a tip located on the center axis of the path of the electron beam. Alternatively, the sensor electrode may comprise an elongate portion extending between diametrically opposite sides of the path of the electron beam.

In preferred embodiments of the present invention, the device further comprises a grid electrode disposed between the cathode and the sensor electrode, a grid voltage generator for generating a control voltage on the grid electrode to control electron beam current flowing from the cathode to the anode, and feedback means connected to the grid voltage generator for varying the control voltage in response to a sense current detected from the sensor electrode to maintain a reference electron beam current.

The feedback means preferably comprises a variable bias means for determining the reference beam current.

In particularly preferred embodiments of the present invention, the cathode comprises an area cathode.

The feedback means preferably comprises drive means for varying a drive voltage supplied to the area cathode in response to the sense current detected by the sensor electrode.

The present invention extends to a cathode ray tube display comprising a vacuum electron device as hereinbefore described. The present invention also extends to a field emission display comprising a vacuum electron device as hereinbefore described. Furthermore, the present invention extends to a magnetic matrix display comprising a vacuum electron device as hereinbefore described.

BRIEF DESCRIPTION OF THE DRAWINGS

Preferred embodiments of the present invention will now be described, by way of example only, with reference to the accompanying drawings, in which.

DETAILED DESCRIPTION OF PREFERRED EMBODIMENTS OF THE INVENTION

Figure 1:
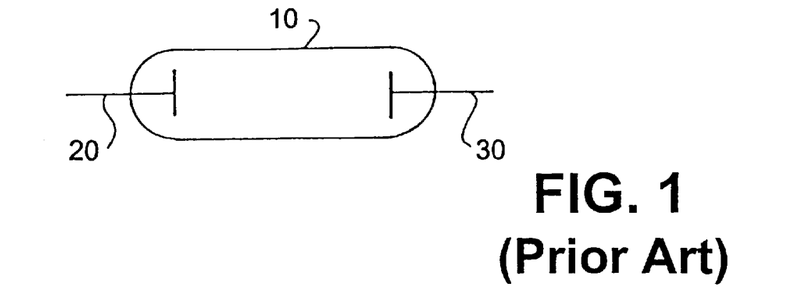
FIG. 1 is a schematic view of a conventional diode vacuum electron device.

Referring to FIG. 1, an example of a simple vacuum electron device is a diode comprising an evacuated tube 10 containing an anode 30 and a cathode 20. In operation, the anode 30 is held at a potential greater than or equal to that applied to the cathode 20. Electrons released from the cathode 20 thus pass through the evacuated tube 10 to the anode 30. The anode current is defined by the number of electrons striking the anode 30.

The current flowing in the diode may be determined by measuring the current flowing into the cathode 20. A disadvantage with this approach is that the cathode may not be 100 percent efficient in electron conversion. Also, there is no certainty that all electrons leaving the cathode 20 will inevitably strike the anode.

The current flowing in the diode may alternatively be determined by measuring the current flowing from the anode 30. This approach is practical provided that the entire anode current is carried in a single electron beam. If the anode current is derived from multiple electron beams, then the current carried by each individual beam cannot be determined.

Figure 2:
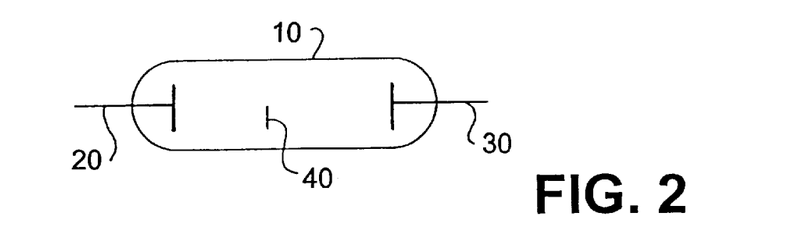
FIG. 2 is a schematic view of a diode vacuum electron device having a sensor plate.

The current flowing in the diode may, by way of a further alternative, be determined by measuring the current flowing in the beam between the anode 30 and the cathode 20. Referring now to FIG. 2, in some embodiments of the present invention, this alternative is implemented by locating an electrically conductive plate 40 in the electron beam path between the cathode 20 and the anode 30. In operation, the plate 40 collects a portion of the beam current thereby reducing the beam current to the anode 30. This technique will be hereinafter referred to as direct sensing. Direct sensing may be employed for measuring both constant and time-varying beam currents.

In other embodiments of the present invention, the plate 40 may be perforated by an aperture of sufficient size to permit passage of the entire electron beam from the cathode 20 to the anode 30. The beam current gives rise to a magnetic field. If the magnetic field is time-varying, a voltage corresponding to the beam current is induced in the plate 40. If the magnetic field is time-invariant, a Hall effect probe or similar device may be employed to measure the static magnetic field and thereby determine the beam current. This technique will hereinafter be referred to as indirect sensing.

Concentrating on direct sensing, if the plate 40 is electrically isolated the negative charge associated with electrons impinging on the plate 40 will be transferred to the plate 40 thereby reducing the potential on the plate 40. The potential reduction modifies the electrostatic fields in the vicinity of the plate 40, thereby disturbing the path of electrons from the cathode 20 to the anode. The negative charge on the plate 40 increases until, at equilibrium, there is sufficient negative potential on the plate 40 to prevent further electron collisions with the plate 40. Electrons then pass around the plate 40 as they are repelled from the vicinity of the plate 40. This is undesirable as an electron beam current measurement cannot now be obtained.

Figure 3:
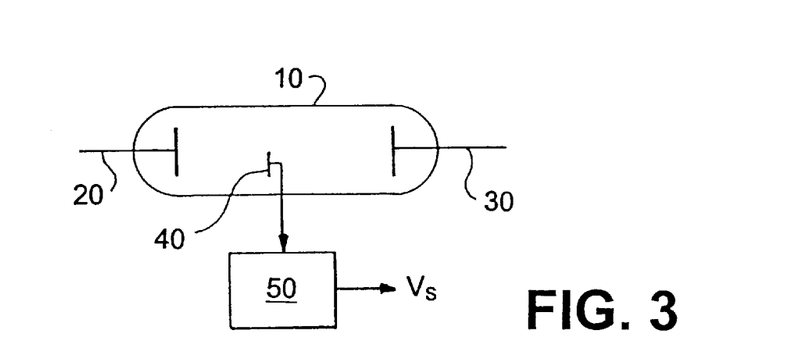
FIG. 3 is a block diagram of the diode vacuum electron device of FIG. 2 connected to diode sensor circuitry.

Referring now to FIG. 3, in preferred embodiments of the present invention, the plate 40 is connected to a conductor which is, in turn, connectable to sensor circuitry 50 located either internally or preferably externally of the device. In operation, electrons striking the plate 40 give rise to a current flow to the plate 40 from the sensor circuitry 50. In the interests of minimizing disruption to the electrostatic field in the vicinity of the plate 40, the sensor circuitry preferably allows the plate 40 to assume the potential required for equilibrium in the field. In practice, some disturbance may nevertheless be introduced by virtue of the plate 40 presenting an equipotential region.

Figure 4:
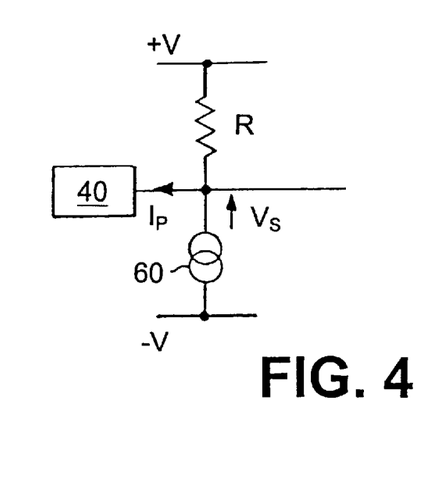
FIG. 4 is a circuit diagram of an example of the diode sensor circuitry.

Referring to FIG. 4, in an embodiment of the present invention, the sensor circuitry 50 comprises an inverting trans-conductance circuit for generating a change in voltage which is proportional to the number of electrons striking the plate 40. The circuit comprises a current sink 60 in series with a resistor R between positive and negative voltage rails V+ and V−. The plate 40 is connected to the node between the current sink 60 and R. The change in voltage is sensed across the current sink 60 as $V_S$. In operation, as electrons strike the plate 40, the current flowing through R increases by dI in view of current $I_P$ flowing into the plate 40 to avoid charge build-up. dI causes a corresponding change of −dv in $V_S$. The transfer function from $I_P$ to $−V_S$ is determined by component values of the circuit. A disadvantage associated with this circuit is that the potential on the plate 40 decreases as beam current increases. The electrostatic field in the vicinity of the plate 40 is distorted as the beam current increases. As the electrostatic field distorts, electrons are deflected away from the plate 40. Less beam current is then detected. The relationship between $I_P$ and the total beam current hence becomes distorted. In practice, this distortion can be tolerated for small changes in the potential of the plate 40.

Figure 5:
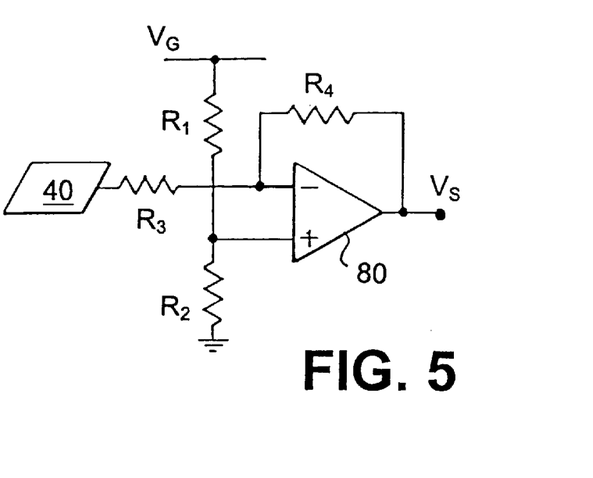
FIG. 5 is a circuit diagram of an example of sensor circuitry for a triode vacuum electron device.
Figure 6:
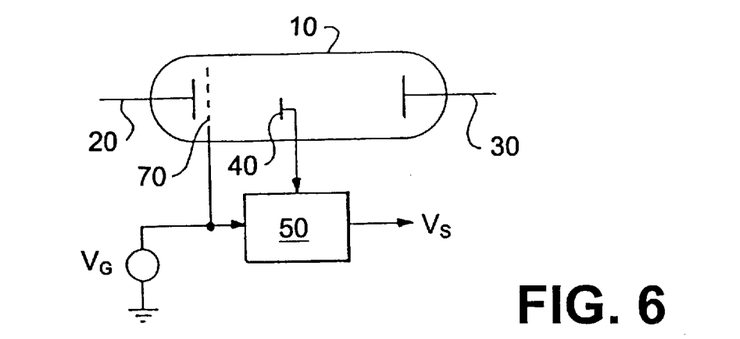
FIG. 6 is a block diagram of a triode vacuum electron device connected to the sensor circuitry of FIG. 5.

Referring to FIGS. 5 and 6, in a modification to the FIG. 4 arrangement for use with a triode vacuum electron device having a grid electrode 70 between the anode 30 and the cathode 20, the trans-conductance circuit is replaced by an inverting amplifier 80 connected to the plate 40 via a resistor $R_3$. A resistor $R_4$ provides negative feedback around the inverting amplifier 80. The input of the amplifier 80 is biased by the control voltage $V_G$ applied to the grid 70. The values for resistors $R_1$ and $R_2$ are selected at least partially in dependence on the position of the plate 40 relative to the grid 70 and the cathode 20. In operation, as the grid voltage rises to produce additional flow of beam current, the virtual earth of the amplifier is forced to rise by the increasing non-inverting input. The plate 40 is then maintained at the required potential. A further advantage of this arrangement is that the impedance at $V_S$ is low.

It will be appreciated that the principle of measuring beam current in vacuum electron devices via a conductive sensing plate 40 is not limited in application to diodes and triodes alone. The present invention is equally applicable to other forms of vacuum electron device, such as electron beam lithography apparatus, synchrotrons, magnetrons, cyclotrons, and cathode ray display technologies such as field emission display technology.

Figure 7:
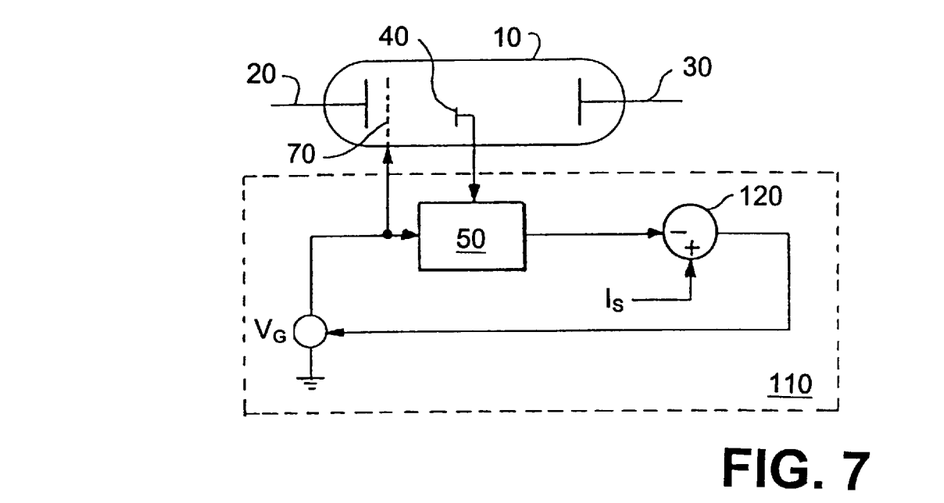
FIG. 7 is a block diagram of the triode vacuum electron device of FIG. 6 connected to a grid voltage feedback control system.
Figure 8:
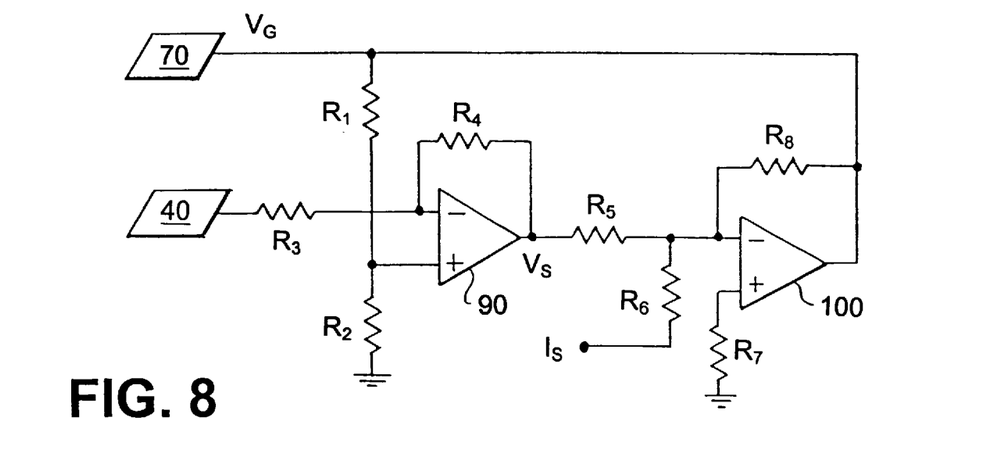
FIG. 8 is a circuit diagram of an example of the feedback control system of FIG. 7.

Referring now to FIGS. 7 and 8, in a preferred embodiment of the present invention, the sensing circuitry 50 of FIG. 5 is employed in a feedback control circuit 110 for controlling beam current in a triode vacuum device. The output of the inverting amplifier 80 is connected via a resistor $R_5$ to the input of a second inverting amplifier 100 having a feedback loop completed by a resistor $R_8$. The output of the second inverting amplifier 100 is connected to a grid 70 of the triode. Suppose that a voltage on the grid 70 of 1 V gives rise to an electron beam current of 1 microamp. Suppose also that the plate 40 intersects 10 per cent of the beam current at 1 microamp. The desired beam current is set by introducing an appropriate current value via a resistor $R_6$ from an input $I_S$. If $R_8$ is much greater than $R_5$ or $R_6$, the gain error of the circuit may be neglected. In the absence of beam current, $I_S$ causes the grid voltage $V_G$ to rise. This causes beam current to flow. The beam current flow is partially intercepted by the plate 40. The output from the sense circuitry $V_S$ begins to regulate $V_G$ via the second inverting amplifier 100 A steady state is reached when the current impinging on the plate 40 is 100 nanoamps. Suppose now that due to a manufacturing error, the distance between the cathode 20 and the grid 70 is incorrect so that, in the absence of the feedback loop, 1 V on the grid 70 provides only 900 nanoamps of beam current and 89 nanoamps of plate current. The feedback loop automatically compensates for the manufacturing error by setting the grid voltage $V_G$ so that 100 nanoamps is intercepted by the plate 40. In the event of such a manufacturing error, the feedback loop may force a grid voltage $V_{grid}$ of greater than or less than 1 V to produce the desired beam current. It will be appreciated then that this arrangement permits a relaxation of acceptance tolerance in the spacings of electrodes within the vacuum device. The shape of the sensor has an effect on the operation of the device, but the requirement for three dimensional positional accuracy is reduced to one of two dimensional accuracy.

In general, vacuum electron devices are responsive to analog input signals. However, it is desirable in some applications to control such a device via a digital system. Such control is usually accomplished by employing a digital to analog convertor (DAC) to convert a digital Econtrol signal generated by the digital system into an analog control signal for driving the vacuum electron device. An electron beam display such as CRT connected to a computer system unit is an example of such an arrangement. The DAC is usually situated in the computer system unit. However, in some high resolution systems, the DAC is situated in the display. Matrix addressed electron displays such as field emission displays have a plurality of DACs connected to a computer system unit via a digital interface. In some arrangements, each DAC corresponds to a different row of pixels of the display. In other arrangement, each DAC corresponds to a different column of pixels of the display. In operation, the DACs control voltages applied to grid electrodes of the display. Whether the DAC is located in the computer system unit or in the display, the DAC output can provide the reference input signal in place of $I_S$ in the feedback control circuit of FIG. 8. It will be appreciated that, where the DAC is local to the display, the feedback control circuit of FIG. 8 may be integrated with DAC.

Figure 9A:
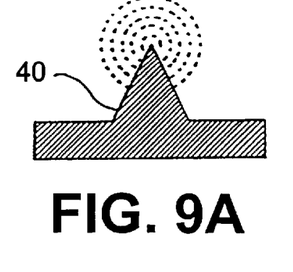
FIG. 9A is a plan view of an example of the sensor plate.
Figure 9B:
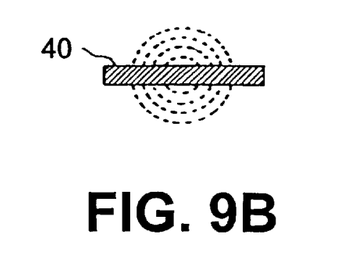
FIG. 9B is a plan view of another example of the sensor plate.

Referring now to FIGS. 9A and 9B, the relationship between the shape of the plate 40 and the current density of the electron beam defines the transfer function between $I_S$ and the beam current $I_b$. This transfer function is generally known as the gamma of the device. In FIGS. 9A and 9B, the electron beam is depicted as series of concentric dotted circles. The circles are intended to indicate that in general the beam diameter increases as the beam current increases. It should be noted however that, in practice, the beam diameter does not necessarily increase with increasing beam current, and likewise that the beam is not necessarily circular in cross section. The representations of the electron beam in FIG. 9A and 9B are for the purpose of explanation only and not to be taken as limiting in any way.

Referring to FIG. 9A, the plate 40 may be triangular in shape. For a constant beam current density, the triangular plate 40 provides a linear relationship between $I_b$ and $I_S$, eg. a gamma of 1. The ratio of $I_S$ to $I_b$ is defined by the apex angle of the plate 40. For example, an apex angle of 36 degrees samples 10 per cent of the beam current.

Referring now to FIG. 9B, the plate 40 may alternatively be rectangular in shape. The rectangular shape enables the plate 40 to be supported at each end for increased rigidity. The gamma for this arrangement is not unity.

It will be appreciated that the gamma for a particular shape of plate 40 depends only on the beam current density. Thus, if the current density of the beam is known over a range of beam currents of interest, the problem of controlling the gamma reduces to a matter of selecting an appropriate plate 40 geometry for the electron beam profile.

Figure 10:
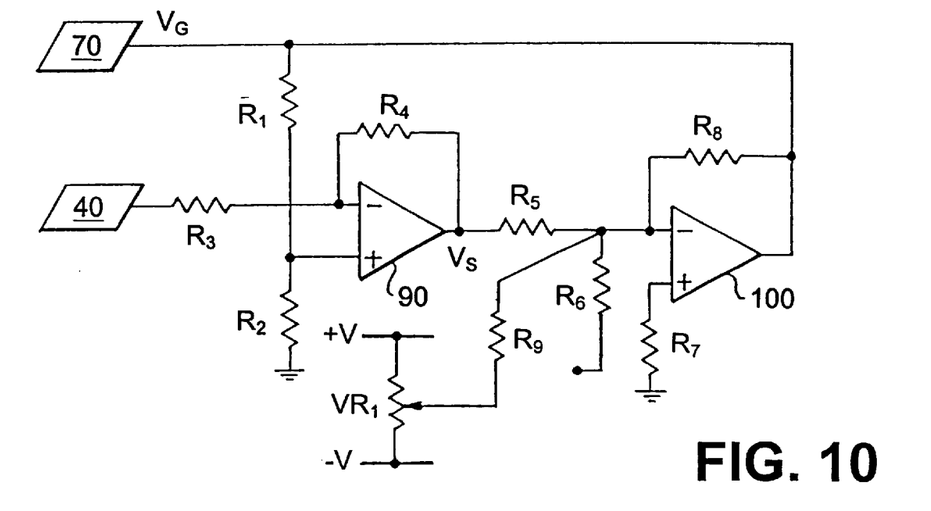
FIG. 10 is a circuit diagram of another example of the feedback control system of FIG. 7.

Referring to FIG. 10, in a modification to the FIG. 8 arrangement for controlling an electron beam display, a variable potential divider $VR_1$ is connected, via a resistor $R_9$ to the input of the second inventing amplifier 100. The potential divider $VR_1$ allows addition or removal of current from the virtual earth of the second amplifier 100. This permits modification of the grid voltage $V_G$ so that a quiescent current may be established, thereby establishing the black level for the display. In operation, the grid voltage $V_G$ causes the beam current required to satisfy the feedback loop condition to impinge on the sensor plate 40. The geometry of the plate 40 determines whether the quiescent current flows only to the plate 40 or whether most of the quiescent current travels further than the plate 40.

Black level control is advantageous in many applications of vacuum electron device technology. For example, referring back to the plate 40 geometry of FIG. 9B, the quiescent operating point of the device may be set, via black level control, such that the first portion of the gamma transfer function falls outside the normal operating range of the device as determined by $I_S$ in FIG. 10. The device thus operates in accordance with a single gamma transfer function. For some cathode types, such as secondary emission cathodes, a quiescent current is required to maintain electron emission after initial turn on. By arranging for the quiescent current to impinge on the plate 40, black level control can be introduced to maintain preferred cathode operation.

Control of gamma and black level are especially desirable in display applications of vacuum electron devices. Such display applications may be generally divided in to two groups.

The first group will hereinafter be referred to as scanned displays. Scanned displays may be raster scanned or vector scanned. In both cases, the electron beam is deflected by magnetic or electrostatic means. The image produced by some such displays may be monochrome. In other displays of the same group, the image may be colour.

The second group will hereinafter be referred to as matrix addressed displays. Such displays include means for generating a plurality of electron beams arranged in a regular matrix. Examples of such displays includes Field Emission Displays (FEDs) and Magnetic Matrix Displays (MMDs). Further details of magnetic matrix displays are provided in co-pending GB patent application number 9517465.2 (Attorney reference UK9-95-019). A matrix addressed display may include an area cathode.

One problem associated with area cathodes is that of cathode aging. Specifically, the ability of the cathode to emit electrons reduces with use. Another problem associated with area cathodes is that of uniformity. Specifically, the density of electron emissions may vary across the plane of the cathode. A further problem associated with area cathodes is that of stability. Specifically, the density of electron emission from a particular location on the plane of the cathode may vary with time. This is not aging effect. Instead the variations may occur over a period of milliseconds to minutes. These effects may combine to produce a visible brightness non-uniformity in a display comprising an area cathode. From the following detailed description it will be appreciated that the electron beam current sensing techniques hereinbefore described provide solutions to the above problems.

An example of a closed loop beam current control system 110 embodying the present invention together with modifications thereto has been hereinbefore described with reference to FIGS. 7 to 10. In those examples, the grid 70 of the vacuum electron device assumes the potential required to satisfy the beam current demanded. Thus, in those examples, the value of the grid voltage $V_G$ is no longer as significant as the value of beam current. This is a different mode of operation to that of a conventional scanned or matrix addressed display. In such displays, the grid voltage $V_G$ has a known value which is set to determine the beam current.

What follows is a brief description of examples of area cathodes to which the current control system 110 hereinbefore described is applicable.

Thermionic area cathodes are formed with complex extractor and director grid assemblies to produce uniform electron distribution. The current control system 110 hereinbefore described permits simplification of the grid assemblies by assisting in maintaining electron uniformity.

Figure 11:
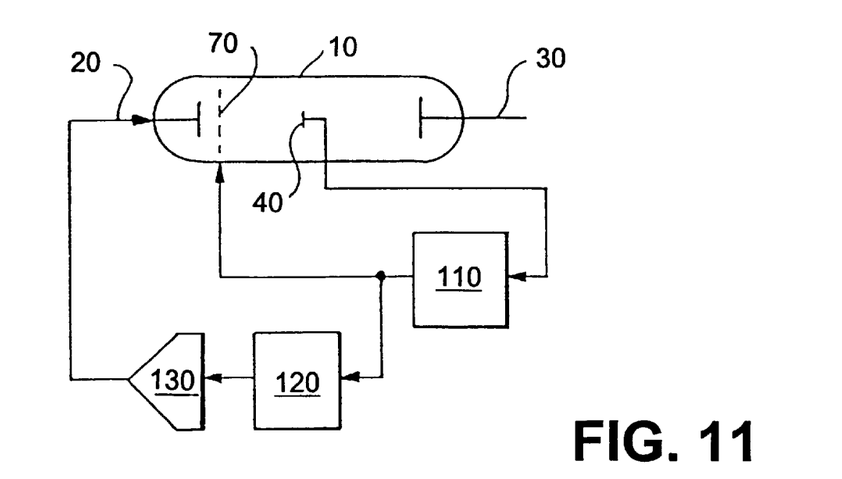
FIG. 11 is a block diagram of a triode vacuum electron device connected to a grid voltage and cathode voltage feedback control system.

In Metal-Insulator-Metal (MIM) cathodes, a potential is applied across front and back metal plates to cause electron tunnelling out of the front face. Electron emission from a typical MIM cathode degrades with time because of a combination of gold ion diffusion and tunnelling site burn out. The emission level can be maintained by increasing the voltage between the plates accordingly. Referring to FIG. 11, in a preferred embodiment of the present invention, the cathode 20 is a MIM cathode. The grid voltage $V_G$ produced by the current control system 110 is also monitored by a micro-controller 120. In operation, the micro-controller records changes in the grid voltage $V_G$ with time, and modifies, via a digital to analog convertor 130, the potential applied to the plates of the cathode 20 to compensate for electron emission degradation and thus to maintain a nominal emission level.

A typical transmissive photo-cathode comprises a substrate coated on one side with a photo-sensitive material and supported in a vacuum. The substrate transmits wavelengths of light for producing electron emissions from the photo-sensitive material. In operation, the side of the substrate remote from the photo-sensitive material is illuminated by a light source. In a typical reflective photo-cathode, the photo-sensitive material is illuminated directly to emit electrons. For both types of photo-cathode, the light source may be a short wavelength lamp such as a Xenon, Mercury, or Krypton lamp operating in the ultraviolet band of light wavelengths. The rate of electron emission from the photo-cathode depends on the incident light power and the quantum efficiency of the photo-sensitive material. Photo-cathodes also age with time. In a preferred embodiment of the present invention, the cathode 20 is a photo-cathode and the arrangement shown in FIG. 11 is employed to control the power supplied to the lamp. It will be appreciated that this arrangement also compensates for aging effects in the lamp itself.

Field emission cathodes employ a strong electric field intensity to lift electrons from the surface of the cathode material. This effect is pronounced when the cathode material is formed into an array of atomically sharp tips. In a preferred embodiment of the present invention, the cathode comprises a an array of field emission tips and the control arrangement of FIG. 11 is employed to control the voltage applied to the tips to compensate for long term variations in emission current.

The above mentioned cathode technologies will be described in further detail later.

It will be appreciated that the embodiments of the present invention hereinbefore described with reference to FIG. 11 are applicable to each cathode in a display having a multiple cathodes each providing electrons to a different region of the display screen.

Figure 12:
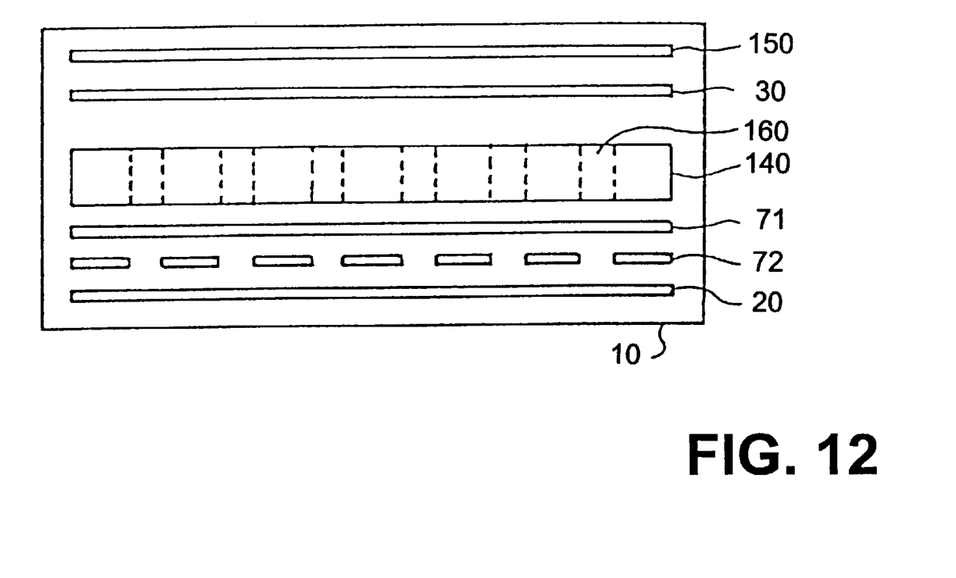
FIG. 12 is a simplified cross-sectional view of an example of a Magnetic Matrix Display device.
Figure 14:
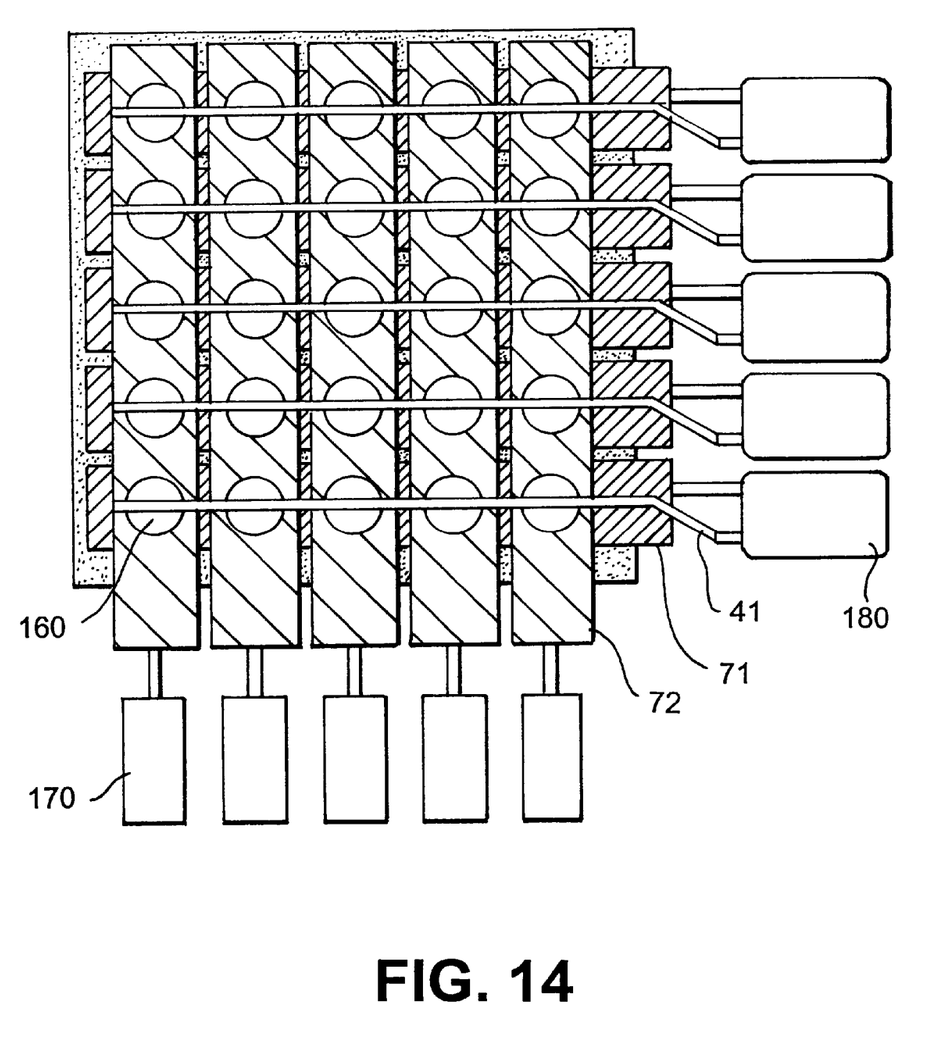

Referring now to FIGS. 12 and 14, an example of a magnetic matrix display device comprises a plane cathode 20 facing a plane anode 30. A phosphor coating 150 is disposed on the side of the anode 30 remote from the cathode. A permanent magnet 140 is disposed between the anode 30 and the cathode 20. The magnet 140 is perforated by a two dimensional matrix of channels or "wells" 160. A grid assembly is disposed between the magnet 140 and the cathode 20. The grid assembly comprises first and second electrically isolated arrays of parallel conductors hereinafter referred to as first grids 71 and second grids 72 respectively. The first grids 71 are arranged orthogonally to the second grids 72 to form a lattice pattern. Apertures are formed in the first grids 71 and the second grids 72. The apertures are located at each intersection of a first grid 71 and a second grid 72. Each aperture is aligned with a different well 160. Column drive circuitry 170 is connected to the second grids. Row drive circuitry 180 is connected to the first grids. In operation, the anode 30 is held at a higher potential than the cathode 20. Electrons emitted from the cathode 20 are thus accelerated towards to the anode 30. As electrons enter each of the wells 160 in the magnet 140 they are collimated into a dense beam by the magnetic field therein. In operation, admittance of electrons to the wells is selectively controlled via the grid assembly. Each well 160 is addressable by appropriate voltage signals applied by the row drive circuitry 180 and the column drive circuitry 170 to the corresponding first grid 71 and second grid 72. Electrons are thus selectively admitted or blocked from entering each well 160, passing through the magnet 140 and reaching the corresponding region of the phosphor coating 150 to generate a pixel of a displayed image on the screen. The pixels of the displayed image are scanned in a refresh pattern. To produce the refresh pattern, a column of pixels is energised by applying an appropriate voltage, via the column drive circuitry 170 to the corresponding second grid 71 with the voltage on the first grids 71 set via the row drive circuitry 180 so that no beam current flows. The voltages on the remaining second grids are set by the column drive circuitry 170 so that no beam current flows for any operating voltage on the first grids 71. The voltages on the first grids 71 are then modulated by row drive circuitry 180 as a function of input video data corresponding to the energised column of pixels. The process is then repeated for the next successive column.

Figure 13:
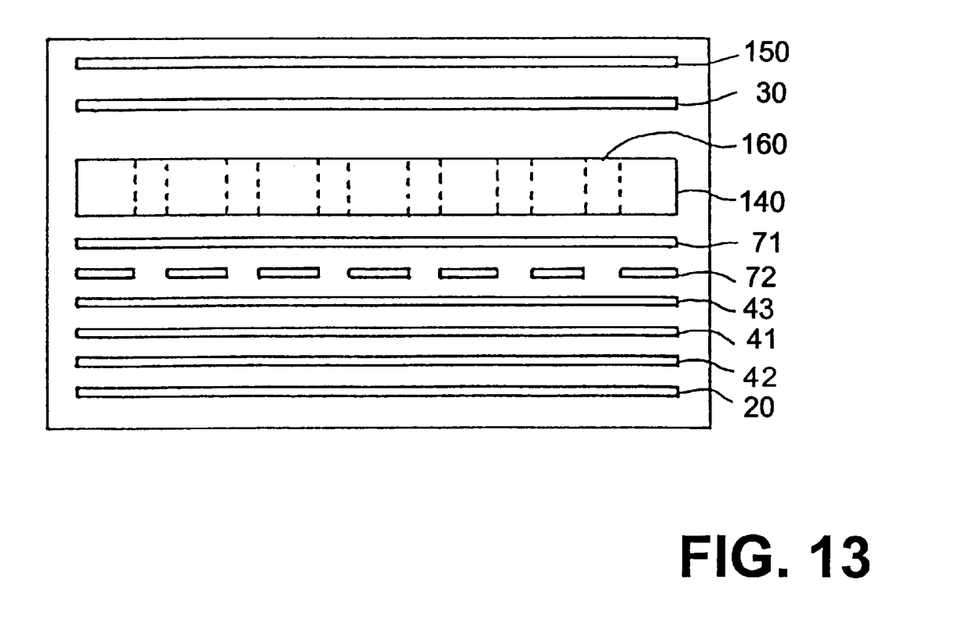
FIG. 13 is a simplified cross sectional view of another example of a Magnetic Matrix Display Device; and, FIG. 14 is a plan view of an example of a Magnetic Matrix Display Device.

Referring now to FIGS. 13 and 14, in a preferred embodiment of the present invention, there is provided an array of conductive sensor strips 41 parallel to the first grids 71 and disposed between the second grids 72 and the cathode 20. Each sensor strip 41 passes through the centre of the apertures in the corresponding first grid 71. The sensor strips 41 are electrically isolated from the first grids 71 and the second grids 72. It will be appreciated from the earlier description of the refresh pattern employed in the display that the current flowing in each sensor strip at any time corresponds to one active pixel only. Each sensor strip thus provides a measure of the beam current in each individual pixel of the corresponding row. The voltage applied to the corresponding first grid 71 to drive the pixel is controlled by the feedback control system hereinbefore described, with the sensor strip 41 replacing the plate 40 and the first grids 71 replacing the grid electrode 70. In the interests of simplicity, the feedback control system may be integrated into the row drive circuitry 180. Each sensor strip 41 may be 10 micrometers wide and 1 micrometer thick and formed from Aluminium, Tungsten or Nickel. In a particularly preferred embodiment of the present invention, the sensor strips 41 are formed by sputtering Nickel onto a glass plate 42 of about 100 micrometers thickness. The Nickel is then etched into parallel strips. The apertures are then etched into the glass. Each sensor strip then supported by the glass across the diameters of the apertures in the corresponding row. In an especially preferred embodiment of the present invention a second glass layer 43 is deposited onto the Nickel. The sensor assembly comprising the strips 40, and glass layers 42 and 43 is laminated between the second grids 72 and the cathode 20. This arrangement advantageously provides precise mechanical spacing and, since each aperture has access only to a limited region of the cathode 20, reduced crosstalk between adjacent pixels. This arrangement also provided increased rigidity with reduced capacitive coupling between the grid assembly and the sensor strips 41.

It will be appreciated from FIG. 14, that the first grids 71, the second grids 72, and the sensor strips 41 have relatively large surface areas. The sensor strips 41 are therefore susceptible to capacitive coupling to the first grids 71 and the second grids 72. It will be appreciated that the susceptibility to capacitive coupling is both distance and frequency dependent. In an example of a colour magnetic matrix display device, beam indexing is employed to sequentially address the electron beam emerging from each well 160 to red, green and blue sub-pixels of the corresponding pixel. The video voltage corresponding to the each primary colour is placed on the corresponding first grid 71. The frequency of signals applied to the first grids 71 is therefore three times greater than that of the signals applied to the second grids 72. Thus the second grids 72 effectively shield the sensor strips 41 from the higher frequency signals on the first grid 71.

As mentioned earlier, the magnetic field in each well 160 collimates the corresponding electron beam from the cathode. The collimation effect is such that the diameter of the electron beam remains substantially constant until it reaches the anode 30 for a constant beam current. Thus, the sensor strips 41 can effectively be placed at any point in the path of the electron beams. It is desirable to minimise DC offset on the signal from the sensor strips 41. Therefore, it is preferably to locate the sensor strips 41 between the cathode and the second grids 72. In a conventional CRT display, the electron beam in this region is relatively diffuse. Focusing of the beam is usually performed further along the beam path. However, in a Magnetic Matrix Display Device, the beams are already under the influence of the magnetic field from the magnet 140 in this region. Therefore, the current density in the grid/cathode region is better defined. In especially preferred embodiments of the present invention, the sensor strips are placed equidistantly from the cathode 20 and the second grids 72 to minimise the aforementioned capacitive coupling effects. As mentioned earlier, the glass/sensor strip laminated assembly is especially useful for effecting the above spacing.

It will be appreciated that the sensor strips 41 produce some disruption to the formation of the corresponding electron beams. Specifically, each sensor strip effectively produces a shadow in the corresponding electron beam. However, the collimating effect of the magnet, coupled with the size of the sensor strips is such that the shadows cast in the electron beams do not noticeably impair the displayed image under normal viewing conditions.

The embodiments of the present invention hereinbefore described provide a solution to the problem of eliminating electron emission density variations from area cathodes based on field emission, photo-emission, thermionic emission, or MIM technologies. It will be appreciated however that the present invention is not limited in application to those technologies and that the present invention is equally applicable to solving the same and other problems with similar area cathode technologies such thin field emission, field emission metal-insulator composites, hot electron cold cathode, second emission cathode, and gas plasma cathode technologies.

In a typical example of a 1280×1024 well magnetic matrix display device embodying the present invention, 0.18 micro-amps is supplied per pixel well with a cathode loading of up to 1 mA/cm$^2$. The average beam current for the display is then typically 180 micro-amps for a brightness of 100 candela/m$^2$ with a 52% transmission face-plate.

What follows is a detailed description of field emission, photo-emission, thermionic emission, and MIM area cathode technologies.

Beginning with photo-emissive cathode technology, some photo-emissive materials in small area cathodes can supply peak currents of up to 132 A with average currents of 35 mA. Relatively large area photo-cathodes are available in both visible and infra-red wavelengths. Such photo-cathodes typically have photon efficiencies in the range 0.5% to 25%. In general, such photo-cathodes comprise three or four thin film layers. For example, Bi—Ag—O—Cs (generally known as S-10) has an efficiency of 6% and a relatively low resistivity, thus allowing relatively high current generation without developing a voltage drop sufficient to cause electro-chemical deterioration. Higher efficiencies of up to 25% are available from multi-alkali materials such as Na$_2$KSbCs (generally known as S-20). However, such materials generally have a higher resistivity, thus limiting the maximum available current. Manufacture of materials such as S-10 and S-20 typically includes evaporating the thin films in vacuum. This can be simplified by initially coating a glass substrate with materials which can be handled in air (such as the silver oxide layer). Then, after evacuation, a heating element with the remaining constituents is taken through several temperature levels to evaporate each constituent in turn. A caesium surface is highly reactive and can easily be contaminated by oxygen and other gases. Therefore, a high vacuum with good gettering is desirable.

In "A High Resolution Image Tube for Integrated Circuit Fabrication", Advances in Electronics and Electron Physics, Academic Press, N.Y., 1969, Vol.28A,pp47–59, O'Keefe and vine describe an electron beam imaging device for electron beam integrated circuit resist exposure. The device comprises an air stable 7 cm diameter ultra-violet photo-cathode comprising a 4 nano-meter layer of Palladium illuminated by a Mercury lamp. The sensitivity of the photo-cathode is 200 micro-amps per watt with stable current densities of up to 100 micro amps/cm$^2$. For an emitter area close to the magnet in the display device embodiments of the present invention hereinbefore described, the emitting area corresponding to each well is typically 2×10$^{-4}$cm$^2$. An emission density of 1000 micro amps/cm$^2$ is therefore desirable. However, other materials with lower work functions, such as gold for example, may serve as replacement for Palladium, and lamps with lower wavelengths, such as Krypton lamps, may be substituted for the mercury lamp. Higher current levels are possible because electron emissions appear to increase as a function of the square of the difference between the work function of the emissive material and the excitation electron-volts of the lamp. In practise, outgassing from the resists contaminate the cathode. However, in a normal vacuum, as found within a magnetic matrix display, the cathode has indefinite life.

In general, uniform emission over the whole emissive surface of an area photo-cathode is rare. However, as mentioned earlier, in preferred embodiments of the present invention, uniformity is maintained via a closed loop current sensing feedback system. Also as mentioned earlier, a current sensing feedback system may also track long term cathode efficiency and compensate for losses therein by varying lamp power.

Photo-cathodes eliminate the problem of magnet heating associated with thermionic cathodes. In the interests of manufacturing simplicity, an ultra violet light activated noble metal photo-cathode is preferred.

Returning now to MIM cathodes, electron emissions in a vacuum can be obtained from a MIM thin film structure of aluminium-aluminium oxide-gold in response to application across the structure of relatively low voltages in the range 10 V to 20 V. A problem with this arrangement is that efficiency is only 1%. Furthermore, the electron current produced by this arrangement tends to be unstable and the lifetime tends to be short. The short lifetime stems from gold ion diffusion through to the base metal and from emission sites shorting out. In a modification to the structure, there is provided a base aluminium layer, a dense aluminium oxide layer, a porous aluminium oxide layer, and a discontinuous gold layer. The modification achieves an efficiency of 1% at an applied voltage of 20 V, leading to an electron emission of 1 mA/watt. Emission density is increased to 100 mA/cm$^2$ and lifetime reaches 5000 hours. The increase in life appears to stem from the porous aluminium oxide layer preventing gold ion diffusion and also preventing short circuits. The modification is still a relatively unstable current source, presenting a 5% variation peak to peak at 10 micro amps and increasing as the current level drops.

In a preferred example of a magnetic matrix display device embodying the present invention, the cathode comprises a MIM cathode. The problem of limited lifetime is solved by dividing the MIM cathode into a plurality of individually actuable stripes extending in a direction parallel to the columns of wells. Each stripe of the MIM cathode corresponds to a different column of wells. In operation, each stripe is sequentially activated as the corresponding column of wells is activated. It will be appreciated that in other embodiments of the present invention, each column of wells may correspond to a selectively actuable group of cathode stripes. This arrangement simplifies manufacture and the associated cathode drive circuitry. In particularly preferred embodiments of the present invention, the groups of stripes are staggered so that adjacent columns of pixels on the screen are held off, thereby reducing cross-talk between adjacent pixels. It will be appreciated that, if the refresh rates are relatively slow, the stripes can be activated in advance of the instant at which electron emissions are needed. Such a MIM cathode structure can be produced via relatively simple low cost evaporation and self-limiting anodic growth anodising. The tope electrode may be deposited in small islands of between 10 and 100 micro-meter diameter via holographic exposure. Cathode stripe may be produced by printed circuit board accuracy photolithography and etching. The top layer is preferably left intact after etching to provide a complete flat zero volt plane. The MIM cathode can then be activated by application of a negative voltage to the lower electrode. Experiment suggests that such cathodes are air stable in the sense they regain their emission characteristics without loss after a 400° C. vacuum bake.

As mentioned earlier, in preferred embodiments of the present invention, instability in the electron current produced by a MIM cathode is eliminated via a closed loop current sensing feedback system.

In a preferred embodiment of the present invention, there is provided a display device comprising: a plane cathode; a permanent magnet; a two dimensional array of rows and columns of channels extending between opposite poles of the magnet for receiving electrons from the cathode; a screen having a plurality of phosphor pixels each corresponding to a different channel and each facing the side of the magnet remote from the cathode; grid electrode means disposed between the cathode means and the magnet; anode means disposed between the screen and the magnet; address means for supplying control signals to the grid electrode means to control flow of electrons from the cathode through each channel to the corresponding pixel; and an anode drive circuit for supplying anode drive signals to the anode means for accelerating electrons through the channels; wherein the cathode comprises a plurality of selectively actuable cathode strips parallel to the columns of channels, each strip corresponding to a different sub-set of the columns of channels. Each sub-set preferably comprises a plurality of channels.

Turning now to thermionic cathodes, an example of a typical thermionic filament emitter comprises an array of oxide coated tungsten wires supported on a carrier. The wires are typically between 1 and 20 micro meters thick. In operation, the wires are usually heated to 700° C. by passing a current through them. The oxide coating is typically produced by deposition of a mixture of $CaCO_3$, $SrCO_3$, and $BaCO_3$. After a vacuum is established in the device, the cathode is activated by heating. This causes the carbonates to decompose leaving a triple oxide behind. A fourth oxide such as Scandium, Europium, or Indium oxide may be included to reduce cathode emission degradation with time. Direct heating of the wires by current flow produces a voltage drop along the length of the wires. This produces a variation in gird to cathode voltage across the cathode surface and therefore along a row or a column of wells depending on the orientation of the wires. The grid drive circuitry may be adapted to provide appropriate compensation in the grid drive voltages. However, this complicates the grid drive circuitry. Alternatively, both ends of each wire may be driven by an AC source, so that a zero voltage is provided under the corresponding active row, provided the wires are parallel to the columns.

The problem imposed by voltage drop along the wires can be overcome by indirectly heating the wire. In some embodiments of the present invention, the cathode may comprise a tungsten wire coated with a layer of $Al_2O_3$ and wrapped with a continuous coil of thinner tungsten wire. The complete cathode structure is then coated with oxides. In operation, the central wire is heated by passage of AC or DC current and the outer coil is held at zero volts.

An oxide cathode typically operates at 720° C. A ferrite-based permanent magnet typically has a Curie Point of 450° C. It is desirable then, where the magnet is located in close proximity to the thermionic cathode, to thermally insulate the magnet from the cathode. Because, in preferred embodiments of the present invention, the cathode and magnet are both disposed in a vacuum, the only path of heat transfer is via radiation. Heat is radiated uniformly around the cathode. Therefore, less than half the total heat can reach the magnet. The magnet has a relatively large thermal mass and, in particularly preferred embodiments of the present invention, is connected to a heat sink at the edges.

In a typical example of a hot wire thermionic area cathode (generally referred to in the art as a "virtual cathode"), directly heated filament strips are placed in front of a deflector plate. Side plates are positioned around the periphery of the strips to compensate for emission drop off stemming from cooling at the filament terminations. Wire mesh director grid are disposed above the filament strips. In operation, the director grids drag electrons from the filament strips and direct them towards a stack of control grids. In underlying principle behind such cathode signs is to extract electrons from narrow strip sources and diffuse them to provide a uniform flow of electrons onto the control grids. However, in practice, any structure in the path of the electrons will tend to produce a shadow on the target. In display applications, such a shadow may produce visible effect on the screen.

As mentioned earlier, in preferred embodiments of the present invention, uniformity of the electron current produced by a hot wire area cathode is maintained via a closed loop current sensing feedback system.

In particularly preferred embodiments of the present invention, a zero voltage cathode plane is provided by positioning an electrically conductive ground plate around 100 micro meters above a hot wire area cathode. The ground plate is perforated by an array of 100 micro meter diameter holes each corresponding to a different pixel well. In operation, the cathode wires are held at a slightly voltage relative to the ground plane. Electrons extracted from the cathode wires are thus reflected behind the ground plate. The positive potential of the control grids draws the electrons from behind the ground plate into the wells. The ground plate may be produced by sputtering or evaporating aluminium (or the like) on 100 micro meter borosilicate glass and then etching the perforations.

Moving on now to field emission cathode technology, a typical field emission cathode comprises an array of atomically sharp tips of a material such as Molybdenum. In operation, a very high electric field is applied to the tips via a cathode control grid. The field allows electrons to be drawn of the tips without application of heat. A voltage of 30 V between the cathode control grid and the tips typically provides sufficient electric field strength to produce electron flow. In some preferred embodiments of the present invention, the cathode control grid is divided into individually addressable row and columns to permit selective activation of different areas of the tip array.

As mentioned earlier, in preferred embodiments of the present invention, uniformity of the electron current produced by a field emission cathode is maintained via a closed loop current sensing feedback system. It will also be appreciated that the feedback system may be employed to compensate for long term aging effects in the field emission cathode. In some embodiments of the present invention, the field emission cathode may be divided into selectively addressable stripes in a similar manner to the MIM cathode hereinbefore described to increase the lifetime of the cathode.

What is claimed is:

1. A cathode ray tube display comprising a vacuum electron device having an evacuated envelope containing a cathode device for supplying electrons to form an electron beam current, an anode device spaced from the cathode device for receiving the electron beam current, said current directed towards said anode device through said evacuated envelope, and a sensor electrode located between the cathode and the anode and extending into a path of the electron beam current, wherein electrons of said electron beam current strike said sensor electrode for directly sensing said electron beam current.

2. A field emission display comprising a vacuum electron device having an evacuated envelope including a cathode device for supplying electrons to form an electron beam current, an anode device spaced from the cathode device for receiving the electron beam current, said current directed towards said anode device through said evacuated envelope, and a sensor electrode located between the cathode and the anode and extending into path of the electron beam current, wherein electrons of said electron beam current strike said sensor electrode for directly sensing said electron beam current.

3. A magnetic matrix display comprising a vacuum electron device having an evacuated envelope including a cathode device for supplying electrons to form an electron beam current, an anode device spaced from the cathode device for receiving the electron beam current, said current directed towards said anode device through said evacuated envelope, and a sensor electrode located between the cathode and the anode and extending into a oath of the electron beam current, wherein electrons of said electron beam current strike said sensor electrode for directly sensing said electron beam current.

4. A vacuum electron device comprising an evacuated envelope including a cathode device for supplying electrons to form an electron beam current, an anode device spaced from the cathode device for receiving the electron beam current, said current directed towards said anode device through said evacuated envelope, and a sensor electrode located between the cathode and the anode and extending into a path of the electron beam current, wherein electrons of said electron beam current strike said sensor electrode for directly sensing said electron beam current.

5. The vacuum electron device as claimed in claim 4, wherein the sensor electrode comprises a triangular portion having a tip located on the center axis of the path of the electron beam.

6. The vacuum electron device as claimed in claim 4, wherein the sensor electrode comprises an elongate portion extending between diametrically opposite sides of the path of the electron beam.

7. The vacuum electron device as claimed in claim 4, further comprising a grid electrode disposed between the cathode and the sensor electrode, a grid voltage generator for generating a control voltage on the grid electrode to control electron beam current flowing from the cathode to the anode, and feedback means connected to the grid voltage generator for varying the control voltage in response to a sense current detected from the sensor electrode to maintain a reference electron beam current.

8. The vacuum electron device as claimed in claim 7, wherein the feedback means comprises a variable bias means for determining the reference electron beam current.

9. The vacuum electron device as claimed in claim 7, wherein the cathode comprises an area cathode.

10. The vacuum electron device as claimed in claim 9, wherein the feedback means comprises drive means for varying a drive voltage supplied to the area cathode in response to the sense current detected by the sensor electrode.

* * * * *